(12) United States Patent
Laletin

(10) Patent No.: US 7,253,680 B2
(45) Date of Patent: Aug. 7, 2007

(54) AMPLIFIER SYSTEM WITH CURRENT-MODE SERVO FEEDBACK

(75) Inventor: William H. Laletin, Slidell, LA (US)

(73) Assignee: World Energy Labs (2), Inc., Torrance, CA (US)

(*) Notice: Subject to any disclaimer, the term of this patent is extended or adjusted under 35 U.S.C. 154(b) by 86 days.

(21) Appl. No.: 11/006,350

(22) Filed: Dec. 7, 2004

(65) Prior Publication Data

US 2005/0116773 A1    Jun. 2, 2005

Related U.S. Application Data

(63) Continuation-in-part of application No. 10/831,885, filed on Apr. 26, 2004, now Pat. No. 7,078,965, and a continuation-in-part of application No. 10/443,230, filed on May 21, 2003.

(51) Int. Cl.
  *H03F 3/45* (2006.01)
(52) U.S. Cl. .......................... 330/69; 330/85
(58) Field of Classification Search ............ 330/69, 330/85, 259, 260; 327/560
  See application file for complete search history.

(56) References Cited

U.S. PATENT DOCUMENTS

| | | | |
|---|---|---|---|
| 2,354,877 A | 8/1944 | Peters | 320/5 |
| 2,662,211 A | 12/1953 | Marko et al. | 324/29 |
| 2,853,676 A | 9/1958 | Ellis | 324/29.5 |
| 3,621,359 A | 11/1971 | Schnegg | 320/43 |
| 3,626,270 A | 12/1971 | Burkett et al. | 320/35 |
| 3,808,487 A | 4/1974 | Feuillade | 320/21 |
| 3,873,911 A | 3/1975 | Champlin | 324/29.5 |
| 3,909,708 A | 9/1975 | Champlin | 324/29.5 |
| 3,984,762 A | 10/1976 | Dowgiallo, Jr. | 324/29.5 |
| 3,997,834 A | 12/1976 | Winter et al. | 324/29.5 |
| 4,035,718 A | 7/1977 | Chandler | 324/5 G |
| 4,053,824 A | 10/1977 | Dupuis et al. | 324/29.5 |
| 4,074,204 A | 2/1978 | Broburg et al. | 330/109 |
| 4,080,560 A | 3/1978 | Abert | 324/29.5 |
| 4,112,343 A | 9/1978 | Douglas | 318/674 |
| 4,181,885 A | 1/1980 | Gosser et al. | 324/428 |
| 4,204,162 A | 5/1980 | Froidevaux | 324/430 |
| 4,259,639 A | 3/1981 | Renirie | 324/430 |

(Continued)

FOREIGN PATENT DOCUMENTS

WO    WO 97/36182    10/1997

*Primary Examiner*—Henry Choe
(74) *Attorney, Agent, or Firm*—Mark S. Leonardo; Brown Rudnick Berlack Israels LLP

(57) ABSTRACT

A system and method for compensating an amplifier apparatus for low frequency and/or DC components of an externally applied input signal as well as for any voltage offsets contributed by the amplifier circuitry. Band-limited servo feedback is applied to predetermined nodes in the forward gain path to null out unwanted signal components, leaving a residual signal that, when amplified, will be centered around ground, so that the full dynamic range of the amplifier system may be utilized. Consequently, the signal-to-noise ratio available at the output of the amplifier system will be maximized. The servo compensation may either operate in continuous time, or it may be held constant once a suitable level of compensation has been established, or it may be adjusted from time to time to accommodate slow variations of the average DC component of the input signal.

41 Claims, 12 Drawing Sheets

U.S. PATENT DOCUMENTS

| | | | |
|---|---|---|---|
| 4,295,097 A | 10/1981 | Thompson et al. | 324/429 |
| 4,305,039 A | 12/1981 | Steuernagel et al. | 324/425 |
| 4,321,541 A | 3/1982 | Nishizuka | 324/426 |
| 4,360,779 A | 11/1982 | Peled et al. | 324/434 |
| 4,361,809 A | 11/1982 | Bil et al. | 324/426 |
| 4,376,485 A | 3/1983 | Shah | 209/575 |
| 4,388,618 A | 6/1983 | Finger | 340/636 |
| 4,413,221 A | 11/1983 | Benjamin et al. | 320/48 |
| 4,433,294 A | 2/1984 | Windebank | 324/426 |
| 4,433,295 A | 2/1984 | Zaugg | 324/429 |
| 4,453,129 A | 6/1984 | Lissalde et al. | 324/429 |
| 4,491,802 A | 1/1985 | Uchida et al. | 330/260 |
| 4,540,951 A | 9/1985 | Ozawa et al. | 330/267 |
| 4,659,994 A | 4/1987 | Poljak | 324/426 |
| 4,697,134 A | 9/1987 | Burkum et al. | 320/48 |
| 4,707,795 A | 11/1987 | Alber et al. | 364/550 |
| 4,719,428 A | 1/1988 | Liebermann | 324/436 |
| 4,728,877 A | 3/1988 | Adamson | 320/21 |
| 4,743,855 A | 5/1988 | Randin et al. | 324/430 |
| 4,816,768 A | 3/1989 | Champlin | 324/428 |
| 4,825,170 A | 4/1989 | Champlin | 324/436 |
| 4,829,225 A | 5/1989 | Podrazhansky et al. | 320/14 |
| 4,849,700 A | 7/1989 | Morioka et al. | 324/427 |
| 4,876,513 A | 10/1989 | Brilmyer et al. | 324/427 |
| 4,881,038 A | 11/1989 | Champlin | 324/426 |
| 4,885,528 A * | 12/1989 | Tanaka et al. | 324/713 |
| 4,912,416 A | 3/1990 | Champlin | 324/430 |
| 4,931,367 A | 6/1990 | Brecht et al. | 429/50 |
| 4,947,124 A | 8/1990 | Hauser | 324/430 |
| 4,952,861 A | 8/1990 | Horn | 320/23 |
| 4,958,127 A | 9/1990 | Williams et al. | 324/426 |
| 4,968,942 A | 11/1990 | Palanisamy | 324/430 |
| 5,032,825 A | 7/1991 | Kuznicki | 340/636 |
| 5,040,126 A | 8/1991 | Allington | 702/47 |
| 5,047,971 A | 9/1991 | Horwitz | 364/578 |
| 5,061,898 A | 10/1991 | Oram et al. | 324/427 |
| 5,107,191 A | 4/1992 | Lowndes et al. | 318/139 |
| 5,140,269 A | 8/1992 | Champlin | 324/433 |
| 5,166,623 A | 11/1992 | Ganio | 324/427 |
| 5,179,340 A | 1/1993 | Rogers | 324/428 |
| 5,191,291 A | 3/1993 | Taylor | 324/429 |
| 5,214,385 A | 5/1993 | Gabriel et al. | 324/434 |
| 5,307,000 A | 4/1994 | Podrazhansky et al. | 320/14 |
| 5,315,253 A | 5/1994 | Alexandres et al. | 324/429 |
| 5,325,041 A | 6/1994 | Briggs | 320/44 |
| 5,369,364 A | 11/1994 | Renirie et al. | 324/430 |
| 5,394,089 A | 2/1995 | Clegg | 324/427 |
| 5,404,106 A | 4/1995 | Matsuda | 324/431 |
| 5,432,452 A | 7/1995 | Fiorina et al. | 324/427 |
| 5,451,880 A | 9/1995 | Yamagishi et al. | 324/429 |
| 5,457,377 A | 10/1995 | Jonsson | 320/5 |
| 5,572,136 A | 11/1996 | Champlin | 324/426 |
| 5,574,355 A | 11/1996 | McShane et al. | 320/39 |
| 5,619,417 A | 4/1997 | Kendall | 364/483 |
| 5,757,192 A | 5/1998 | McShane et al. | 324/427 |
| 5,771,178 A | 6/1998 | Stemporzewski et al. | 702/45 |
| 6,043,631 A | 3/2000 | Tsenter | 320/148 |
| 6,052,027 A | 4/2000 | Candy | 330/260 |
| 6,141,169 A | 10/2000 | Pietruszynski et al. | 360/67 |
| 6,160,455 A | 12/2000 | French et al. | 330/297 |
| 6,262,619 B1 | 7/2001 | McGreer et al. | 327/307 |
| 6,262,627 B1 | 7/2001 | Ghiozzi et al. | 330/51 |
| 6,291,962 B1 | 9/2001 | Ogura et al. | 318/609 |
| 6,411,098 B1 | 6/2002 | Laletin | 324/436 |
| 6,445,195 B1 | 9/2002 | Ward | 324/684 |
| 6,462,615 B1 * | 10/2002 | Tanghe | 327/560 |
| 6,465,993 B1 | 10/2002 | Clarkin et al. | 323/272 |
| 6,584,196 B1 * | 6/2003 | Sacca et al. | 379/405 |
| 6,590,447 B1 | 7/2003 | Willis | 330/84 |
| 6,621,279 B2 | 9/2003 | Ward | 324/684 |
| 6,636,107 B2 | 10/2003 | Pelly | 327/552 |
| 6,646,508 B1 | 11/2003 | Barbetta | 330/264 |
| 6,674,294 B2 | 1/2004 | Ward | 324/684 |
| RE38,454 E | 3/2004 | Walters et al. | 323/272 |
| 6,700,453 B2 | 3/2004 | Heiskala et al. | 332/103 |
| 6,700,522 B2 | 3/2004 | Ivanov et al. | 341/155 |
| 6,713,462 B2 | 3/2004 | Metcalf, III et al. | 514/82 |
| 6,717,461 B2 | 4/2004 | Krishnapura et al. | 327/552 |

* cited by examiner

AMPLIFIER SYSTEM WITH CURRENT-MODE SERVO FEEDBACK

CROSS REFERENCE TO RELATED APPLICATIONS

This is a continuation in part of U.S. patent application Ser. No. 10/831,885 filed on Apr. 26, 2004 now U.S. Pat. No. 7,078,965 and U.S. patent application Ser. No. 10/443,230 filed on May 21, 2003 which are hereby incorporated by reference in their entirety.

FIELD OF THE INVENTION

The present invention relates to servo offset compensation for an amplifier, and more particularly, to controllable active feedback circuits which can substantially attenuate a DC signal component or a predetermined range of low frequency components present in the output signal of the amplifier.

BACKGROUND OF THE INVENTION

When it is desirable to use an amplifier to detect and amplify only the time-varying components of a signal that may also contain a non-zero static or average DC component, it is necessary to remove or otherwise null out this unwanted DC signal component. This may be achieved by inserting suitable high-pass networks in the forward signal path, or by applying low frequency negative feedback around the amplifier to confer a high-pass characteristic upon the overall amplifier system.

Overview of the Forward-Path Approach:

Provided that the frequencies of interest are well above DC (i.e., above zero Hertz), coupling capacitors placed in the forward gain path of an amplifier may suffice to remove unwanted DC and low frequency components. However, to avoid excessive amplitude and phase distortion, the effective cutoff frequency of each coupling capacitor operating in conjunction with the input impedance of the associated amplification stage should be much lower than the lowest frequency of interest in the input signal. If the required cutoff frequency is very low, physically large and often expensive capacitors will be needed. In the special case wherein the input signal includes any square or rectangular waveform components of relatively low frequencies (that is, as compared to the high-pass cutoff frequency), the shape of the waveforms will appear distorted, exhibiting a 'tilt' in the waveform plateaus. This type of distortion can be troublesome in precision measurement applications, particularly if the shape of the waveform is of importance, mandating the use of even larger coupling capacitors. While it is possible to utilize compensatory algorithms (either in hardware or software) to correct such predictable frequency-related amplitude and phase distortion, the preferred design practice is to avoid the distortion in the first place.

In cases where the input is provided as a differential signal, capacitive coupling of the input signals becomes problematic, since two well-matched capacitors will be needed to preserve adequate common mode rejection. Unfortunately, obtaining matched capacitors is difficult at best, and is often impossible if very low input frequencies must be accommodated.

Generally, capacitors consist of conductive layers separated by layers of insulating material (e.g., dielectric), to form the equivalent of two galvanically isolated parallel plates. All practical dielectrics exhibit some degree of polarization when subjected to an electric field, and it takes a finite amount of time and energy to change this polarization when the applied electric field changes. This mechanism gives rise to dielectric loss and dielectric absorption Accordingly, the non-ideal behavior of a coupling capacitor can distort the signal in a non-linear fashion, which modifications represent distortions in the signal. In demanding applications (pro audio and precision metrology in particular), such distortion, albeit small, is considered unacceptable.

Overview of the Negative Feedback Approach:

As is known, low frequency negative feedback may be applied around an amplifier to impart a predetermined high-pass characteristic to the transfer function of the amplifier. A suitably configured passive feedback network can be employed, comprising either low-pass elements such as inductors placed in series with the feedback signal to directly block high-frequency feedback signals, or capacitive shunt elements disposed to divert high-frequency components out of the feedback loop to local ground. If desired, a combination of both types of elements may be employed provided that loop stability criteria are satisfied. However, when the signals-of-interest contain significant low frequency spectral components, the size, cost and availability of the frequency determining elements in the feedback loop can become problematic.

As an alternative to passive feedback, negative servo feedback may be employed to significantly attenuate DC and low frequency signal components in the main output of an amplifier system.

The term servo feedback implies the use of an active integrator within a negative feedback loop coupled from the output to the input of an amplifier system. In the most basic configuration, an integrator comprises a high-gain differential amplifier provided with capacitive feedback connected between its output and inverting input. The non-inverting input is coupled to a reference potential, while a sampling resistor connects between the main output node and the inverting input of the main differential amplifier, so that the integrator produces an output that represents the inverse of the time-integral of the difference between the main amplifier's output signal and the reference potential. As is known, the DC gain of such an integrator circuit will approach the open loop gain of the embedded differential amplifier, and will fall off at 6 dB per octave as the frequency increases.

The output signal from the integrator may be used directly as the negative servo feedback signal, or it may control means that provide the necessary feedback signal. Since the magnitude of the servo feedback falls off with increasing frequency, the effective closed loop gain of the amplifier system will increase with frequency until an asymptotic value is reached where the gain for AC signals will be equal to the nominal closed loop gain of the amplifier system, as determined in the normal fashion. It is therefore seen that the application of negative servo feedback around an amplifier system will impart a high-pass characteristic to its overall transfer function.

In addition, since the servo loop operates to force the amplifier's output to maintain an average value of DC ground, the residual AC signal appearing at the amplifier's output will appear centered about the local common potential, thereby maximizing the useful dynamic range of the amplifier system.

An illustrative example of a conventional servo feedback design is depicted in FIG. 1, wherein a high-gain differential amplifier, configured as an inverting servo integrator, is disposed to provide low frequency negative feedback around a main amplifier. Element 200, representing the primary forward path amplifier, is connected to provide non-inverting gain determined in the known manner by resistors 203 and 204. Amplifier 400, selected to have large open loop gain, is operative as a single-pole servo integrator due to the connections of local feedback capacitor 409 and input resistor 403 disposed to sample the main output signal at node 601. Reference potential 501 is coupled through resistor 402 to non-inverting input 406 of amplifier 400. The output signal of amplifier 400 constitutes negative servo feedback, conveyed through resistor 202 to non-inverting input 206 of amplifier 200. Since the non-inverting input of amplifier 400 is connected through resistor 402 to reference potential 501, the feedback loop will operate to force the output of amplifier 200 to maintain an average potential equal to the reference potential, which is conventionally signal ground but may be another predetermined DC potential if desired. Provided that amplifier 400 has low input bias current, resistor 403 can assume a very large value without introducing significant offset errors, allowing capacitor 409 to be small while still providing a relatively low cutoff frequency for the amplifier system.

Presumably, the input signal presented at node 101 is derived from a low impedance source, and the output of amplifier 400 also exhibits a low impedance. For the servo feedback to be effective, it must be subtracted from the input signal. This is accomplished by using resistors 201 and 202 to form a voltage divider network, to create at its midpoint the algebraic sum of the input signal and the servo feedback signal. Disadvantageously, this network is a voltage divider that generally attenuates the input signal at all frequencies, degrading the overall signal-to-noise ratio. Moreover, as a consequence of the high impedance exhibited at node 206, any current flowing out of node 408 must flow into the external signal source connected to input node 101, which is generally undesirable.

The latter problem can be overcome by adding unity-gain input buffer 100, as shown in FIG. 2, however the input signal will still be attenuated by the voltage divider formed by resistors 201 and 202. The value of resistor 202 could be increased in value to reduce the attenuation effect, but this would require a commensurately larger DC offsetting signal from the output of amplifier 400, often requiring that the power supply voltages provided to amplifier 400 would also have to be increased, inevitably adding to the overall design complexity and cost.

It is heretofore known to provide servo feedback as a current-mode signal. When current-mode feedback is provided by a high-impedance current source, it may be injected into the forward gain path without the use of a series resistor, thereby avoiding the attenuation problem described above.

An illustrative example is provided in FIG. 3. In this design, the output of the servo integrator is coupled to the base of a transistor so that its collector terminal provides the current-mode feedback signal.

The emitter of transistor 300 is connected to positive power supply 301, and receives a control signal coupled to its base node through resistor 202 from output 408. To compensate for the inverting gain of transistor 300, amplifier 400 must be configured as a non-inverting integrator. Provided that the input signal presented to input 101 has a negative DC bias potential, the servo loop will operate properly so that the average DC value at output 601 will be essentially zero. As is known, a similar circuit employing an NPN transistor could be arranged for input signals exhibiting a positive DC bias. In either case, however, the feedback current is unipolar, so each circuit can only accommodate input signals having the correct polarity.

All of the circuits described hereinbefore are adapted to receive only single-ended input signals. When common-mode noise may be a concern, it is preferable to use an amplifier having differential inputs.

The use of differential voltage-mode servo feedback adapted to provide offsetting compensation for a differential amplifier system was disclosed in U.S. Pat. No. 6,411,098 B1 (hereinafter "the '098 patent") and US application No. US2003/0206021 by Laletin, and subsequently in US Published application No. 2003/0206021, the entire contents of both being incorporated herein by reference.

For convenience, preamplifier 30, shown in the original FIG. 1D of the '098 patent, is reproduced here as FIG. 4, wherein the original element designators have been retained.

A pair of inputs, +Input and −Input, are connected to an external device-under-test (henceforth, "DUT"), so that the potential across the device is conveyed to the non-inverting inputs of buffer amplifiers 104 and 112; resistors 81 and 82 provide return paths for the input bias currents of these buffer amplifiers. Primary amplifier 90 is a conventional differential amplifier, receiving inputs through resistors 85 and 86. Amplifier 93, operative with resistor 91 and capacitor 92, constitutes a servo integrator referenced to ground at its non-inverting input, whose output is conveyed through resistor 87 to the non-inverting input of primary amplifier 90. Additionally, the output of servo integrator 93 is inverted by amplifier 96 and therefrom conveyed through resistor 88 to the inverting input of amplifier 90 as a complementary negative feedback signal.

Since the non-inverting input of servo integrator 93 is connected to ground, the effect of these dual feedback loops is to force the average value of the output of amplifier 90 to remain at ground potential, so that only an amplified version of the AC components of the differential input signal appear centered about ground at main output node 32. The forward gain of amplifier 90 is determined in the known manner according to the values of resistors 85, 86, 87 and 88, while the common mode rejection ratio depends on the ratio match of resistor pairs 85/87 and 86/88. Note that resistors 87 and 88 not only serve as gain setting elements, but are also the coupling elements that convey the servo feedback to the input of differential amplifier 90.

When this circuit is used in conjunction with a composite mixed-mode bridge amplifier comprising both a current-mode driver (22) and a voltage-mode driver (24) as disclosed in FIG. 1D of the '098 patent, both an auto-polarity and a self-centering function may be realized. The feedback signal from the output of servo integrator 93 is used to control a voltage-controlled voltage source (VCVS) driver connected to that terminal of the DUT to which −Input node the overall preamplifier circuit is connected. When a device exhibiting a DC bias is connected between the input terminals of the preamplifier, the servo loop, in conjunction with the VCVS, will operate to establish an equilibrium point such that the potentials present at each of the input terminals will be of opposite polarity. Furthermore, due to the balanced nature of the complementary servo loops, the magnitude of the potential at each input node will be precisely one half of the half of the total DC bias of the DUT, thus effectively "centering" the externally applied bias voltage about local ground.

While this circuit design provides excellent performance as long as resistors 85, 86, 87 and 88 all have the same value, problems arise if a gain greater than unity is required of amplifier 90. To achieve higher gains, the values of resistors

87 and 88 must be made proportionately larger, requiring that the servo feedback signals issuing from amplifiers 93 and 96 increase in magnitude as well to maintain the same amount of DC offsetting capability. This may require that amplifiers 93 and 96 be provided with commensurately greater power supply rails, which can increase circuit complexity and cost.

SUMMARY OF THE INVENTION

The difficulties and shortcomings inherent in the designs described above are overcome by the inventive apparatus and method as set forth below.

In many applications where precision amplification of low-level signals is required, it is desirable to remove certain unwanted components from the input signal prior to subsequent amplification. Such unwanted signal components may exist in externally applied input signals or may arise within the amplification circuitry itself. The illustrative methods and systems described herein according to the present invention are employed to eliminate unwanted DC and low frequency signals by providing complementary servo feedback without the need for blocking capacitors in the forward gain path.

According to an illustrative embodiment of the inventive method, band-limited current-mode negative servo feedback is employed to confer a high-pass output characteristic upon an amplifier apparatus, thereby achieving significant attenuation of DC and low-frequency signals. Consequently, the average DC value of the residual signal present at the main output of the amplifier apparatus is substantially equal to a reference potential.

A servo feedback loop is controlled by a high-gain differential amplifier configured as an integrator exhibiting a closed-loop gain that decreases with frequency at a rate of about 6 dB per octave. The integrator is provided at one input with a suitable reference potential that is usually ground, while the other input of the integrator is adapted to sample the main output signal. The integrator output is coupled to at least one controllable current source, yielding a current-mode feedback signal that is conveyed to a suitable node in the forward gain path of the amplifier apparatus. The unwanted DC components, or a limited range of low frequency signal components, are thereby substantially removed from the main output signal, leaving a residual signal that exhibits an average value substantially equal to a reference potential that is usually equal to ground. To maximize the dynamic range available in the forward signal path of the amplifier apparatus, no significant amount of signal amplification is applied ahead of the point where the servo feedback is injected into the circuit.

One application of the inventive method relates to the measurement of small time-varying signals that are present across the terminals of an electrochemical accumulator that exhibits an intrinsic DC bias potential. The accumulator may be either a single energy storage cell or a battery of cells. Significant information about a cell or battery can be obtained from the characteristics of small time-varying voltages developed across the cell/battery in response to certain types of current excitation. In order to evaluate the condition or state of charge of the cell/battery, it is important to measure the characteristics of these small time-varying voltages with considerable accuracy.

To overcome the limitations of the prior art and confer additional advantages, the present invention provides circuitry to apply, to an amplifier system, low frequency servo feedback proportional to the time-integral of the output voltage of the amplifier system, in a manner that does not compromise other desirable operating characteristics.

An illustrative embodiment of the invention includes an integrator operative in conjunction with a controllable current source having a very high output impedance which provides current-mode servo feedback to remove DC and low-frequency signal components from the output signal of an amplifier system. Since the current-mode feedback signal comes from a high-impedance source, it may be conveyed directly to a high impedance amplifier input node without significantly affecting the effective impedance at these nodes.

According to an aspect relating to both single-ended or differential input amplifier apparatus configurations, the negative servo feedback causes the signals-of-interest (specifically, those residual components remaining in the input signal after the unwanted components are removed) to become centered about ground. Therefore, the signals may be substantially amplified to take advantage of the entire dynamic range of the amplifier system.

In another illustrative embodiment, means are provided whereby a servo correction value may first operate in a 'track mode' to establish an equilibrium condition, and a 'hold mode' to make the servo correction signal remain at a fixed value. The amplifier system can thereby accurately amplify any subsequent variations in the input signal. Such variations may represent not only continuously time-varying AC signals but also step-wise variations representing changes in the DC signal level.

In accordance with another illustrative embodiment, the basic servo integrator may be replaced with a generalized servo controller that incorporates controllable signal processing functions in addition to at least one servo integrator. Such functions may include, but are not limited to, track and hold circuitry, a low-pass filter, a median filter, an envelope detector, a noise-discriminator, and a notch filter having an adjustable width, an adjustable depth of attenuation and an adjustable center frequency.

A single-ended embodiment of the present invention includes an amplifier disposed to receive a single-ended input signal, along with means to generate current-mode servo feedback that is conveyed into the forward signal path of the amplifier.

A first differential embodiment of the invention includes a single differential amplifier disposed to operate as the main forward path amplifier, coupled with a pair of controlled current sources configured to provide complementary servo feedback signals to the inputs of the amplifier. Additional unity-gain input buffer amplifiers may be added to realize a differential amplifier configuration that has high impedance inputs.

A second differential embodiment provides both high gain and wide bandwidth by employing a cascaded amplifier configuration commonly referred to as an instrumentation amplifier. A first gain stage comprises a pair of cross-connected differential amplifiers to which are conveyed complementary current-mode servo feedback signals, and a second gain stage comprises a single differential amplifier.

The present invention embodies certain novel features and improvements, as illustrated in the accompanying drawings and specifications, and as particularly pointed out in the appended claims. However, it should be understood that changes could be made in various details without departing from the spirit and scope of the present invention.

BRIEF DESCRIPTION OF THE DRAWINGS

The foregoing and other features and advantages of the present invention will be more fully understood from the following detailed description of illustrative embodiments taken in conjunction with the accompanying drawings in which.

DETAILED DESCRIPTION

Figure 1:
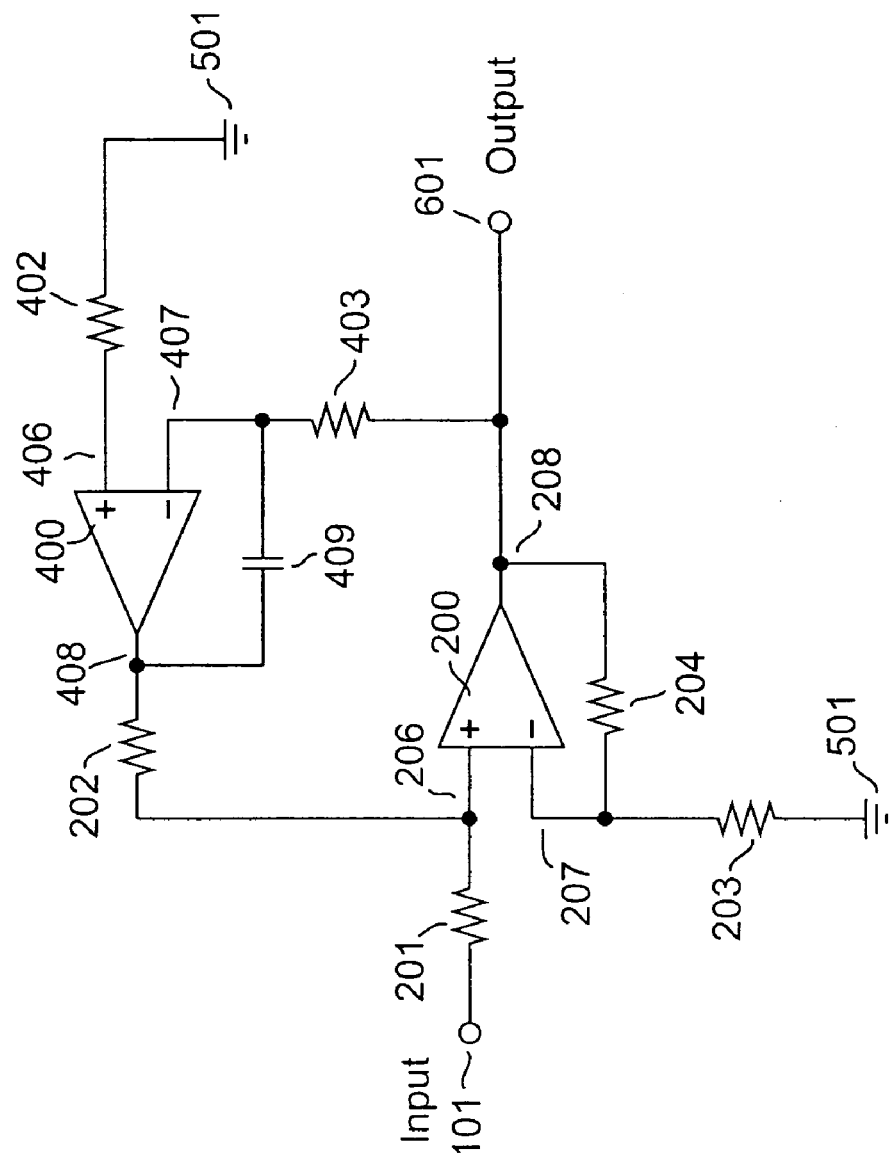
FIG. 1 is a schematic circuit diagram of a single-ended servo amplifier configuration as heretofore known in the art.
Figure 2:
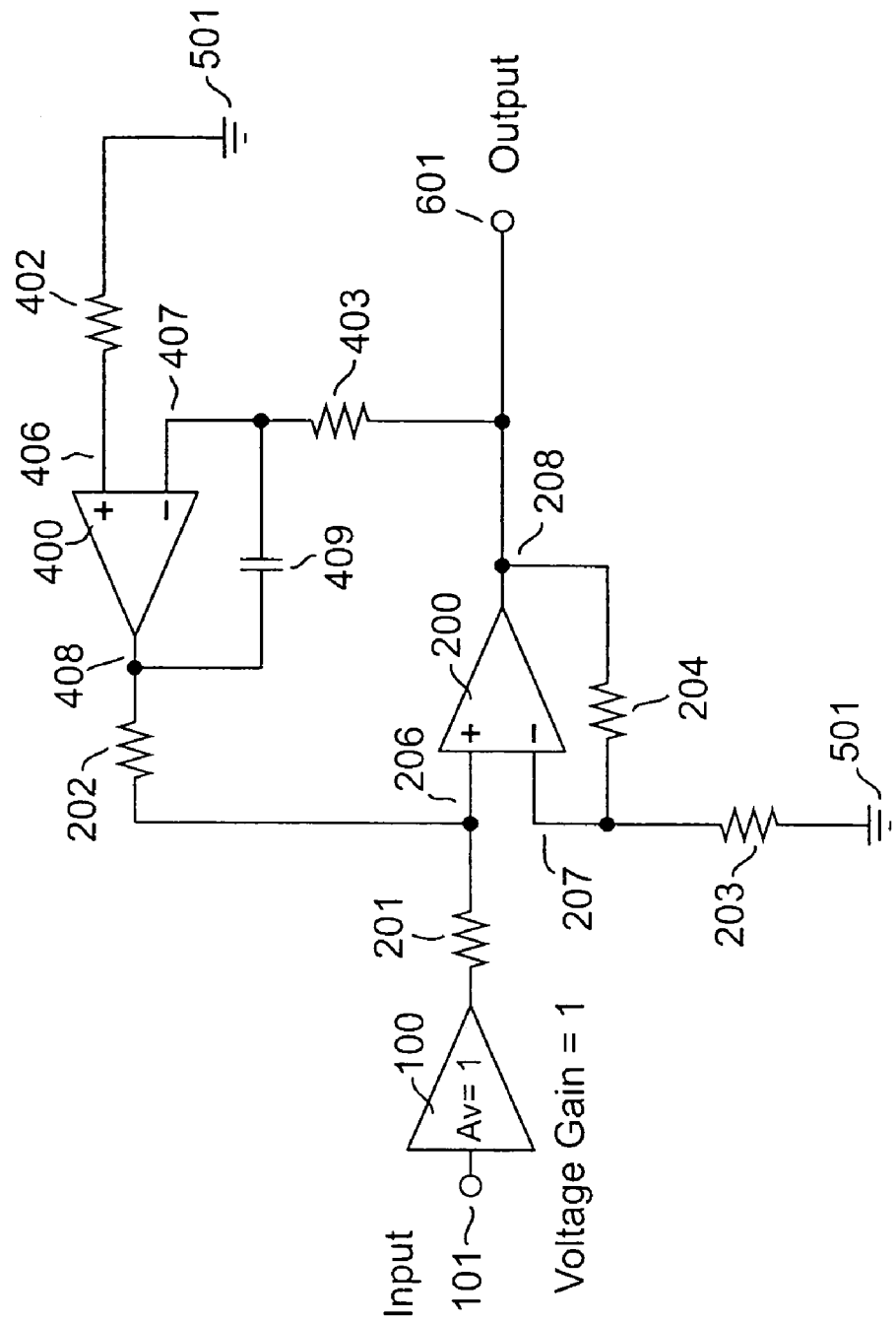
FIG. 2 is a schematic circuit diagram of a buffered single-ended servo amplifier configuration as heretofore known in the art.
Figure 3:
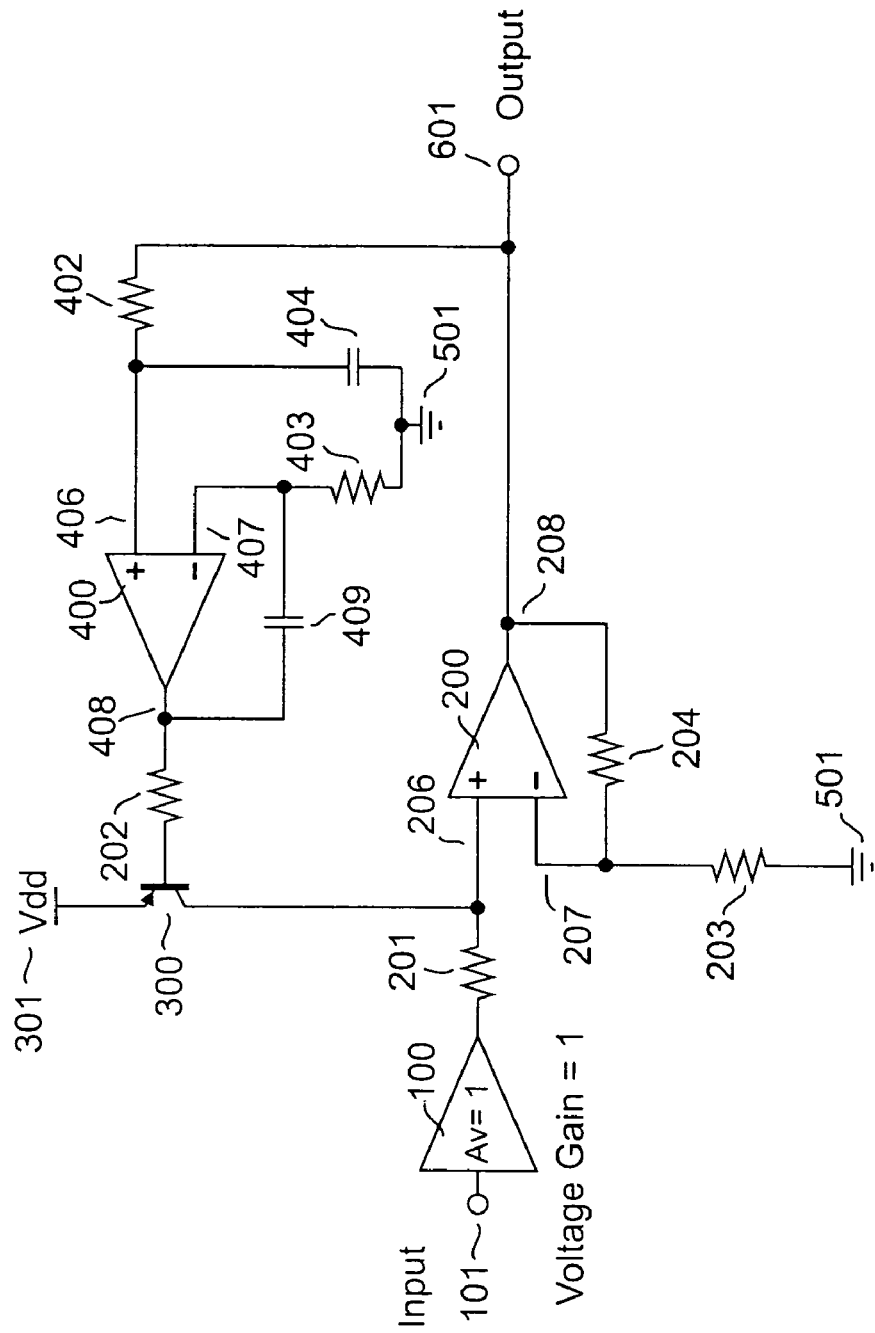
FIG. 3 is a schematic circuit diagram of a single ended amplifier configuration with current mode servo feedback as heretofore known in the art.
Figure 4:
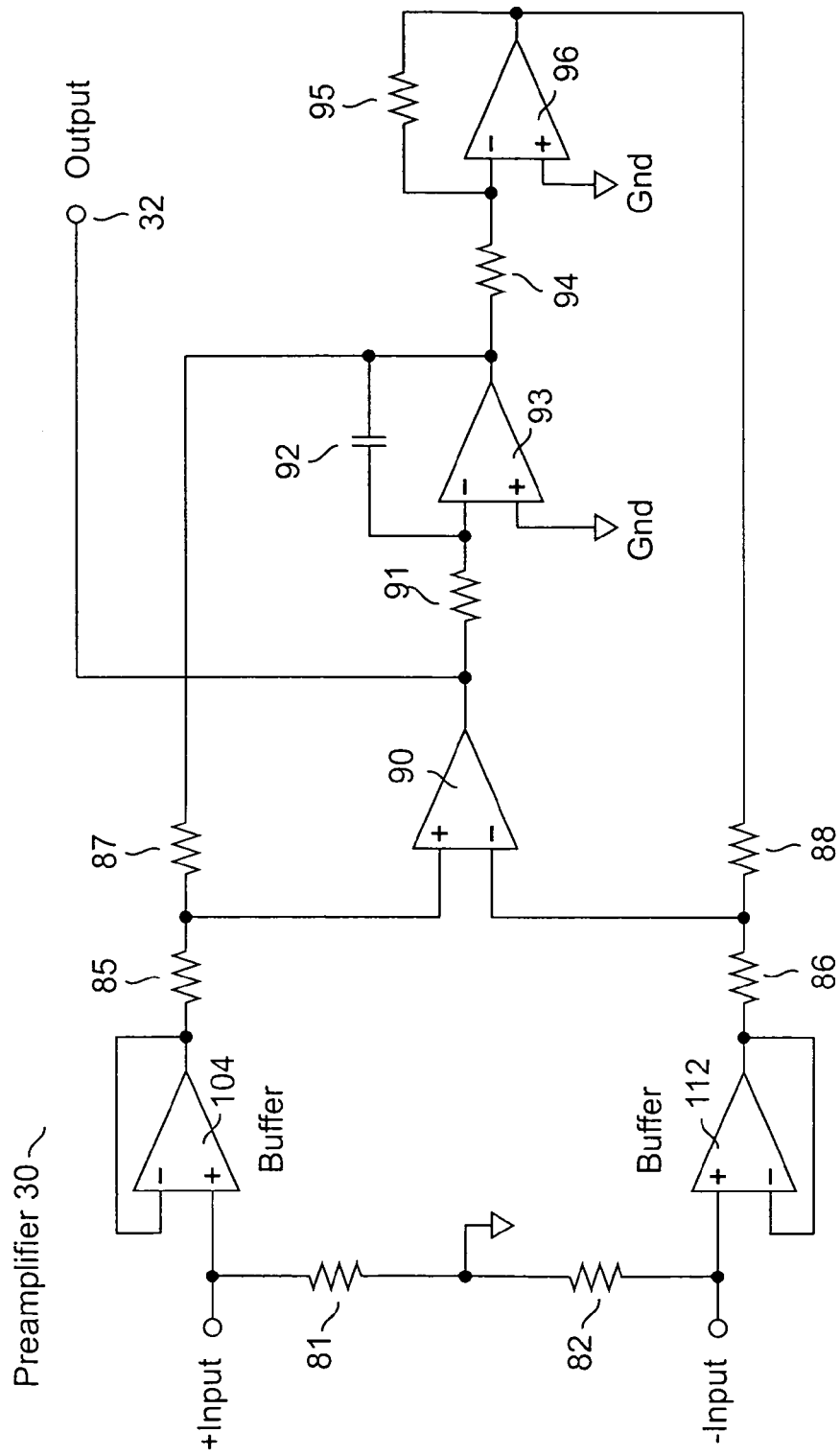
FIG. 4 is a schematic circuit diagram of a differential voltage-mode servo configuration as heretofore known in the art.
Figure 5:
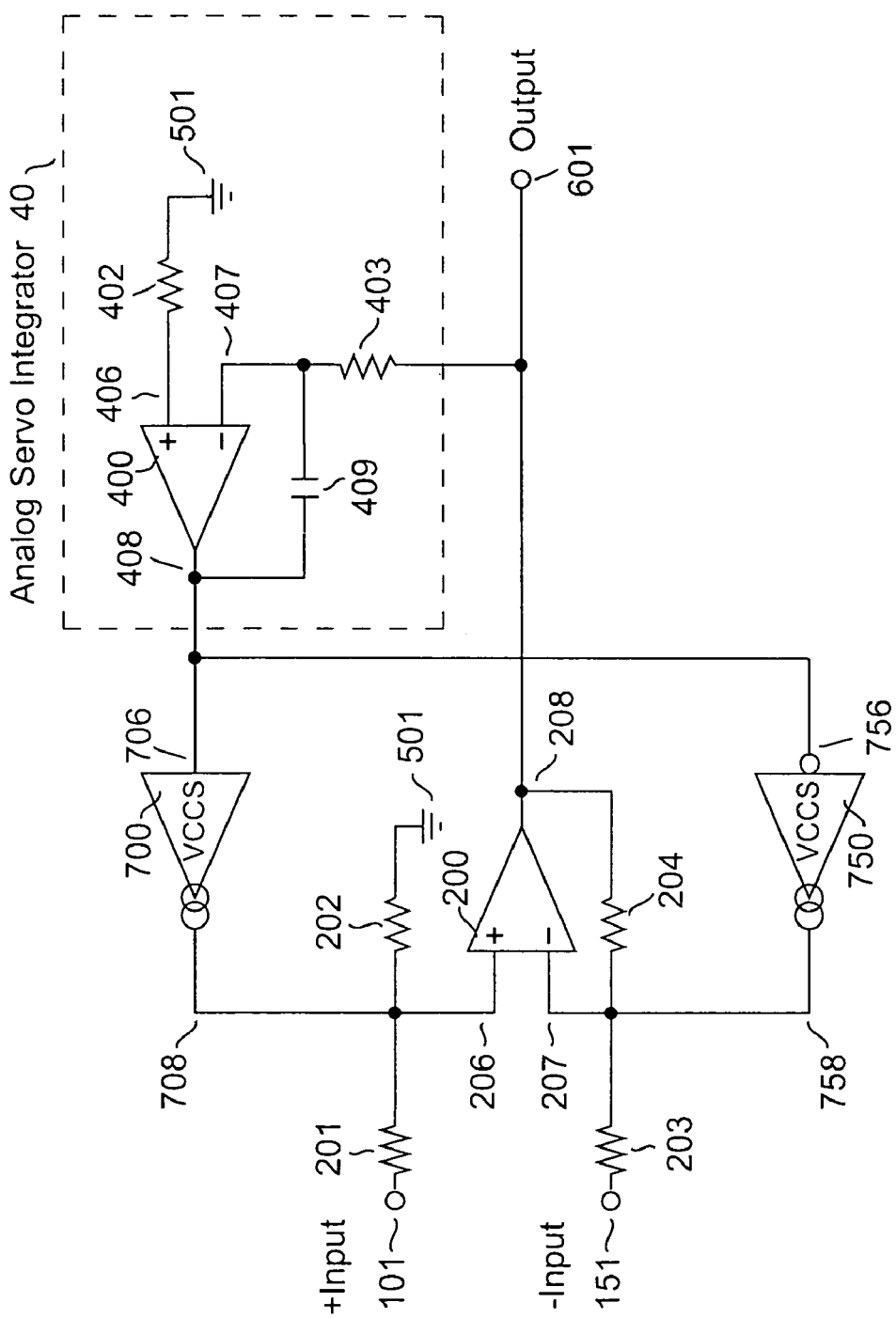
FIG. 5 is a schematic circuit diagram of a differential amplifier configuration with complementary current-mode servo feedback according to an illustrative embodiment of the present invention.

An illustrative embodiment of an amplifier apparatus according to the invention is depicted in FIG. 5. Differential amplifier 200, disposed in the forward gain path of an amplifier apparatus, constitutes a primary amplifier that receives a first input signal through impedance element 201 at its non-inverting input 206, and receives a second input signal through impedance element 203 at its inverting input 207, to produce main output signal 601. In practice, the potential on a first terminal of an external device-under-test (henceforth, DUT) represents the first input signal, while the potential on its second terminal represents the second input signal.

Within this embodiment and for each of the embodiments to be described subsequently, impedance elements 201 and 203 are typically resistors; impedance elements 202 and 204 are generally resistors, but additional capacitors may be added in parallel with each of these to provide local frequency compensation. The forward gain and common-mode rejection ratio of amplifier 200 are determined in the known manner by elements 201, 202, 203 and 204.

Resistor 403 samples main output signal 601 and couples it to inverting input 407 of amplifier 400, while resistor 402 conveys reference potential 501 to non-inverting input 406. With the connection of capacitor 409 between inverting input 407 and output 408, a single-pole integrator is formed having a time constant determined by capacitor 409 and resistor 403. Output signal 408 represents a band-limited signal corresponding to the inverse of the time-integral of the difference between the sampled signal and the reference potential. The gain of an integrator achieves its maximum value at DC, and falls off at 6 dB per octave with increasing frequency at 6 dB per octave, corresponding to a low-pass (e.g., bandwidth-limited) transfer function. When an integrator is used to control a negative feedback loop, it is conventionally referred to as a servo integrator.

Output signal 408 serves as the controlling input 706 (henceforth, the "CCS control signal") for controlled current source 700 that provides a directly proportional output current 708, which current may be either a positive (source) current or a negative (sink) current according to the polarity of its controlling input signal. The symbol used for current source 700 should be henceforth understood to denote a voltage-controlled current source having bipolar (e.g., source/sink) output capability, a non-inverting transfer function and an output impedance typically exceeding at least several megohms. Additionally, signal 408 is coupled as the controlling input 756 to inverting voltage-controlled current source 750, which provides an inversely proportional bipolar output current 758. In similar fashion, the symbol used for current source 750 should be understood to denote a voltage-controlled current source having bipolar output capability, an inverting transfer function and an output impedance typically exceeding at least several megohms. These two current sources receive the same CCS controlling input, and consequently they will provide output currents of substantially identical magnitudes but of complementary (that is, opposite) polarities.

Signal 708, representing a first current-mode negative servo feedback signal, is conveyed from current source 700 to non-inverting input 206 of primary amplifier 200, and signal 758, representing a second current-mode negative servo feedback signal is conveyed from current source 750 to inverting input 207. Due to the low-pass characteristic of this feedback signal, the transfer function of the amplifier apparatus will also be band-limited, exhibiting a high-pass characteristic such that DC signals present in the differential input signal will experience the greatest attenuation, while the attenuation of AC signals will vary inversely with frequency.

When a device-under-test (DUT) exhibiting a DC bias across its terminals is connected between inputs 101 and 151, the servo integrator will operate to establish an equilibrium condition such that average DC potential of the residual signal appearing at main output 601 will be substantially equal to reference potential 501, conventionally ground (although a different potential could be used if desired). When this condition is achieved, the differential DC voltage present between nodes 206 and 207 must also be substantially equal to zero. Since the input impedances, with respect to node 501 (ground), exhibited at input 101 and input 151 are preferably the same, the potential of a biased DUT connected to these inputs will appear "centered" about local ground, such that the magnitudes of the voltages at nodes 101 and 151 will be equal, but they will have opposite polarities.

No current can flow in or out of the high impedance inputs of amplifier 200, or through resistors 202 and 204 because each of these resistors will have zero volts across it. Accordingly, all of the servo feedback current must flow from current source 700, through resistor 201, through the DUT and then back through 203 to current source 750. Due to the complementary nature of the servo feedback currents, the voltages developed by these currents flowing through resistors 201 and 203 will be equal and opposite. The sum of the voltages developed across resistors 201 and 203 must be equal in magnitude to, but opposite in polarity from the average DC potential present across the DUT. Equivalently, the total voltage developed across these resistors by the servo feedback current precisely offsets the average DC potential of the DUT.

Having servo feedback current flow though the DUT may sometimes be undesirable, particularly if the DUT is an electrochemical device such as an energy storage cell or battery. Such current will always flow out of the positive terminal of the DUT and back into its negative terminal, therefore appearing as a net discharging current. In an illustrative application of the inventive method, the amplifier apparatus is employed to detect and amplify the voltage appearing across the terminals of large energy storage cells or batteries of cells. Provided that these cells are sufficiently robust, they should be substantially immune to the effects of small discharge currents, if the duration of such discharging is limited to short periods of time.

While the magnitude of this discharging current could be reduced by proportionately increasing the values of each of the four gain setting resistors 201–204, the noise performance and bandwidth of the circuit will be compromised if these resistors are made too large. Therefore, this circuit may considered when differential voltage sensing is required, subject to the limitation that each DUT can be expected to be sufficiently robust such that it can supply these small discharge currents without causing significant errors.

As mentioned hereinbefore, the forward gain of amplifier 200 is determined in the known manner by the relative values of resistors 201,202, 203 and 204, while the common-mode rejection ratio (CMRR) is determined by the accuracy of the match between two ratios, specifically of resistors 201/202 and resistors 203/204. Small matched capacitors may be connected in parallel with elements 202 and 204 to provide high-frequency compensation. Deviations from the design-center values of these several impedance elements will lead to inaccuracies in the gain and CMMR of the amplifier apparatus. Because the output impedance of each of the current sources is at least several decades larger than the typical values used for resistors 201, 202, 203 and 204, it is expected that these servo feedback connections will have a minimal effect on the accuracy of the differential gain and CMRR as determined by the critical resistor ratios.

In certain specialized applications, the device-under-test (DUT) will be stimulated with an AC current provided by an external circuit, and the amplifier apparatus will be called upon to detect and measure the resulting AC voltage developed across the internal impedance of the DUT. In such applications, it is not uncommon for a significant AC common-mode signal to be present across the DUT, so having good common-mode rejection capability becomes important.

When typical commercial components are used within the amplifier apparatus, the resulting CMRR may be insufficient for precision measurements. Therefore, additional means may be provided to trim the values of the impedance elements surrounding amplifier 200 (i.e., resistors 201, 202, 203 and 204) to maximize CMRR at DC and selected AC frequencies. Moreover, although current sources 700 and 750 will typically have large output impedances, these output impedances appear in parallel with the impedance networks at inputs 206 and 207, potentially leading to small gain and CMRR errors. Hence, controllable means may also be provided to adjust those output impedances when exceptionally high accuracy is required. Such adjustment means may be incorporated as required in any of the embodiments of the inventive method.

Figure 6:
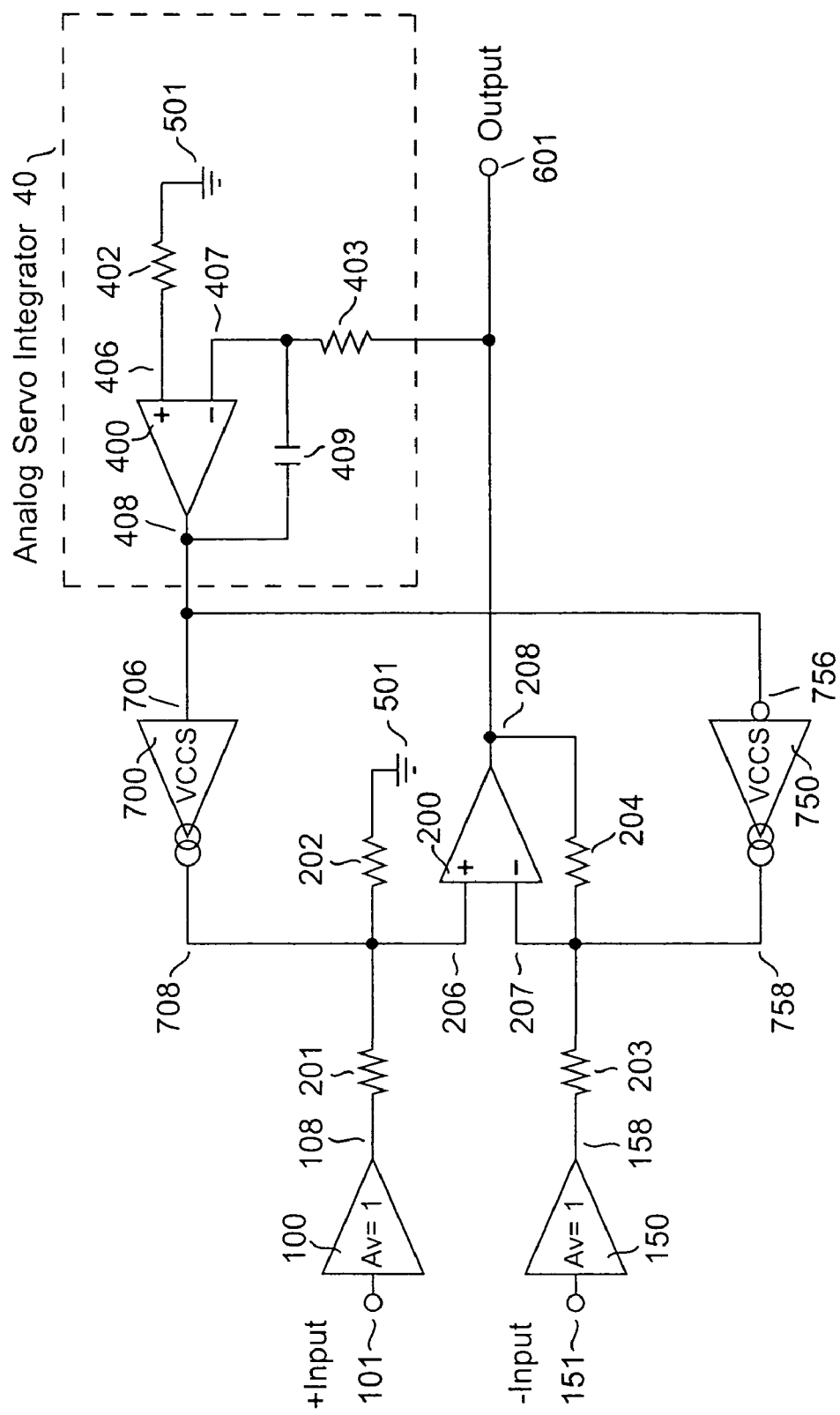
FIG. 6 is a schematic circuit diagram of a differential amplifier configuration with complementary current-mode servo feedback and having input buffers an an analog servo integrator according to an illustrative embodiment of the present invention.

An illustrative differential embodiment of the present invention is depicted in FIG. 6, wherein the amplifier apparatus comprises a pair of input buffers, a primary differential amplifier and servo feedback circuitry. Complementary servo feedback currents are conveyed to the inputs of the primary differential amplifier to achieve DC and low-frequency compensation in the main output signal.

The circuitry and operation of primary amplifier 200, integrator amplifier 400 and both controlled current sources remain unchanged from the previously described embodiment. The addition of the buffer amplifiers however, confers performance advantages as described below.

Input node 101 receives a first input signal from the first terminal of the DUT and unity-gain amplifier 100 provides a buffered copy at output node 108, while input node 151 receives a second input signal from the second terminal of a DUT and unity-gain amplifier 150 provides a buffered copy at output node 158. Due to the high input impedances of amplifiers 100 and 150, the DUT is effectively isolated from the rest of the circuitry. Because the differential voltage present between nodes 108 and 158 is substantially identical to the voltage across the DUT, the rest of the circuit will operate as described previously, with one significant difference: although the servo currents are still constrained to flow only through resistors 201 and 203, these currents no longer flow through the DUT, but are absorbed instead by the low-impedance outputs of unity gain amplifiers 100 and 150.

To ensure that the circuit functions properly in practical applications wherein the DUT has no electrical connection to the amplifier apparatus other than through input connections 101 and 151, bias currents must be supplied to the non-inverting inputs of amplifiers 100 and 150. This may be accomplished for each input amplifier by connecting its input through a very large valued resistor to local ground (or, optionally, another reference potential), recognizing that the values of these biasing resistors should be well-matched. Note that differential amplifiers configured in the conventional manner to operate as unity-gain non-inverting amplifiers could replace the single-ended amplifiers depicted in FIG. 6 without departing from the scope of the invention.

To further improve accuracy, the circuit can be augmented to include circuitry to compensate for the input bias currents of each input amplifier. Additionally, circuitry may be provided to adjust the residual input voltage offset errors of each of the input amplifiers.

Figure 7:
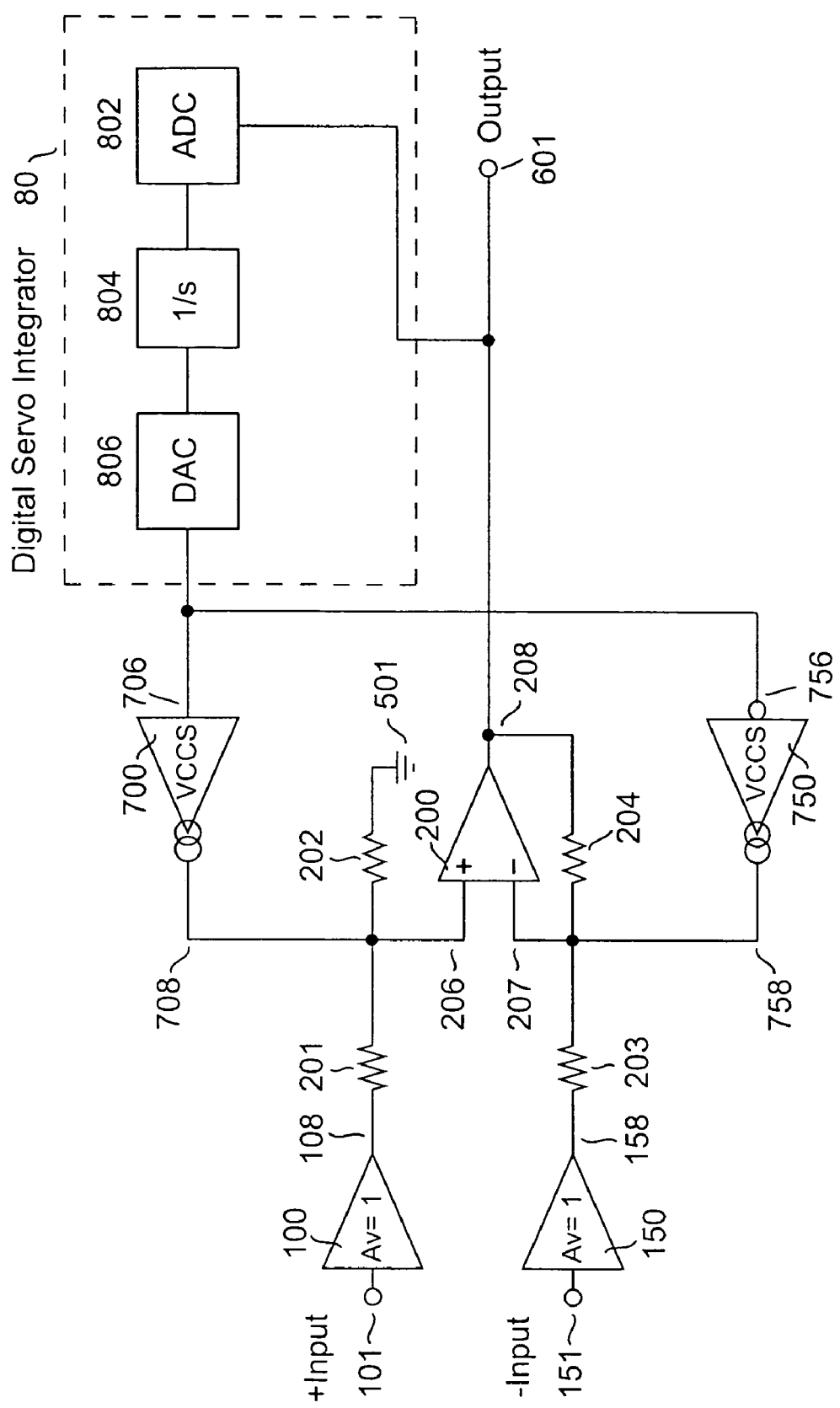
FIG. 7 is a schematic circuit diagram of a differential amplifier configuration with complementary current-mode servo feedback, input buffers and a digital servo integrator according to an illustrative embodiment of the present invention.

Another embodiment of the invention is depicted in FIG. 7. The analog servo integrator is replaced by a composite circuit implemented partially in the digital domain, with suitable digital/analog conversion devices in the input/output signal paths. A copy of output signal 601 is conveyed to ADC 802, where it is converted into a digital representation. An integrator algorithm, operative in suitable digital hardware that may be a microprocessor or a Digital Signal Processor (DSP), performs numerical integration to yield an integrated digital value implicitly referenced to the ground potential. This digital value is conveyed to DAC 806 where it is converted into an analog control signal that is coupled to servo current sources 700 and 750. Thereafter, the amplifier and servo circuitry operates as previously described.

When the inventive amplifier apparatus is embedded within a larger test system that provides controllable excitation current through the device under test to evoke a voltage response differential input capability, wide bandwidth extending to DC, substantial forward gain and accurate servo offsetting are all required. Such test systems include, but are not limited to, electrochemical cell/battery testers and monitoring systems, impedance testers and frequency response analyzers, time-domain response and spectrum analyzers, feedback-loop response analyzers, distortion analyzers, and biochemical test systems. The inventive circuit is especially useful as an embedded sensing circuit, for example in a battery charger, or a larger battery charging/monitoring system. In this application, the output of the inventive amplifier system is conveyed as a feedback signal to the system controller; this feedback is used to by the controller to evaluate the battery's condition, and thence, adjust the charging algorithm in real time to optimize charging efficiency.

The condition and state of charge of an energy storage cell or battery may be determined by analyzing the time-dependent polarization voltage that appears across it in response to excitation by a suitable time-varying current. Such analysis methods include Frequency Response Analysis wherein sine wave excitation is employed, and Time Domain Spectroscopy based on square wave excitation.

For these techniques to yield the best information, it is important that the peak to peak amplitude of the polarization voltage response be kept small, not exceeding a few tens of millivolts. In some extreme cases the peak-to-peak voltage may be on the order of one or two millivolts. It is desirable to be able to measure this small voltage with an accuracy of at least 1 part in 2000 (i.e., equivalent to 0.5% accuracy), so considerable amplification must be used in conjunction with circuitry to null out the DC bias of the cell/battery. Additionally, to accurately reproduce the effects of square-wave current excitation, the frequency response of the amplifier apparatus must extend all the way to DC. These performance criteria are achieved by the design depicted in FIG. 8

To achieve the required amount of gain and still preserve wide-bandwidth capability throughout the forward gain path, it is useful to employ an amplifier system that comprises two cascaded gain stages. A portion of the forward gain is provided by a first gain stage comprising a pair of input differential amplifiers that are cross-coupled in the known manner to provide substantial differential mode gain but no more than unity common mode gain. A second gain stage comprises another differential amplifier, representing the primary differential amplifier that receives a differential input signal from the first stage, and outputs a main signal that is single-ended. This second gain stage is adapted to provide at least unity gain for differential signals while significantly attenuating common-mode input signals. In an embodiment of the inventive method, complementary current-mode servo feedback is provided to the inputs of the cross-coupled differential amplifiers, to null out unwanted low frequency components. By applying the servo feedback to the first gain stage, the DC signal components due to any intrinsic bias voltage of a DUT are significantly attenuated before amplification is applied at the first and second gains stages, thereby maximizing the useful dynamic range throughout the forward gain path.

Differential amplifiers 100 and 150 comprise the first gain stage, accepting a differential input signal presented by a DUT connected to inputs 101 and 151, to yield an intermediate differential output signal coupled to a second gain stage comprising primary differential amplifier 200 and its associated components. Local negative feedback is conveyed to amplifiers 100 and 150 through equal-valued $R_{FB}$ resistors 104 and 154, respectively, while a single gain setting $R_G$ resistor 135 connects between the inverting inputs of the input amplifiers 100 and 150. As is known, this cross-coupled arrangement ensures that each of the input amplifiers will have a common mode gain of only 1, while the overall differential-mode gain of the amplifier pair will be $\{1+(2R_{FB}/R_G)\}$. Small matched capacitors may be placed in parallel with elements 104 and 154 to provide local high-frequency compensation. Controllable means may also be provided whereby the common mode rejection of the first stage may be maximized both at DC and at predetermined AC frequencies. By removing resistor 135, the input amplifiers will each have a nominal gain of unity, whereupon this circuit becomes similar to the embodiment depicted in FIG. 7. But, since the cross-couple amplifier are now enclosed within the overall servo feedback loop, any intrinsic offset voltage errors attributable to amplifiers 100 and 150 will be substantially eliminated by the overall servo feedback.

Amplifier 200 constitutes the primary amplifier, representing the second gain stage. Its input signals correspond to the intermediate output signals developed by the first gain stage. Amplifier 200 is configured to reject common-mode signals while providing a gain equal to or greater than unity for differential mode signals, in a manner previously described. Controllable circuitry to adjust both the common mode rejection ratio and differential gain of amplifier 200 may also be provided. The output of amplifier 200 constitutes the main output signal and appears at node 601 of the cascaded amplifier apparatus, where it is sampled by servo controller 90.

Figure 8:
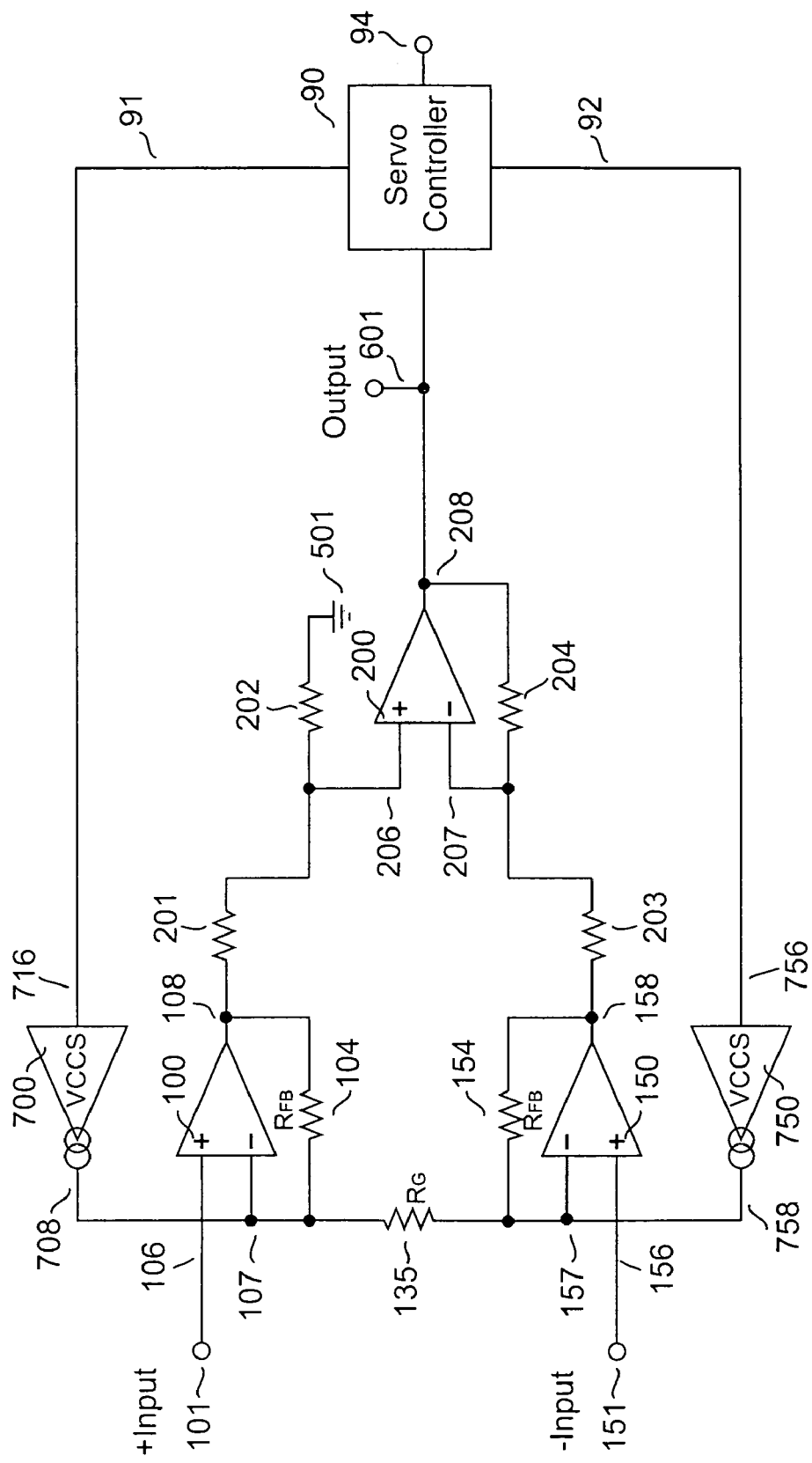
FIG. 8 is a schematic circuit diagram of a differential amplifier configuration with cascaded stages and complementary current-mode servo feedback according to an illustrative embodiment of the present invention.

As shown in FIG. 8, servo controller 90 is adapted to provide control outputs 91 and 92. In this embodiment these are analog control signals preferably equal in magnitude but opposite in polarity, coupled to voltage-controlled current sources 700 and 750, respectively. Alternatively, a single control signal output from servo controller 90 could be used to drive both controllable current sources, provided that one of the current sources has an inverting transfer function. It is within the scope of the invention to employ other types of controllable current sources that may for example be digitally controllable current sources, therefore requiring that servo controller 90 be configured to properly control such current sources.

Current-mode signals 708 and 758 constitute complementary servo feedback. Feedback signal 708 is conveyed directly to inverting input 107 of amplifier 100, while feedback signal 758 is conveyed directly to inverting input 157 of amplifier 150. Controllable circuitry may also be provided to adjust the output impedance characteristics of each current source, such that the common-mode gain of interconnected amplifiers 100 and 151 is substantially equal to the optimum value of unity.

In operation, the servo controller will continually adjust control signals 91 and 92 until the servo feedback currents reach a sufficient magnitude so that main output 601 assumes an average value equal to potential 501 (typically, ground). Due to the intrinsically high input impedances of amplifier 100 and 150, all of the servo feedback current will flow only through resistors 104, 135 and 154, thereby developing voltage drops across each resistor. At equilibrium, the average values at output node 601 is zero, hence the average value of the differential voltage present between node 108 and 158 must be zero as well, which implies that the DC voltage appearing across resistor 135 will be equal to the DC bias of the device connected to inputs 101 and 151.

To ensure proper operation in practical applications wherein the DUT has no electrical connection to the amplifier circuitry other than through input connections 101 and 151, circuitry may be provided to supply bias current to the non-inverting inputs of amplifiers 100 and 150. This may be accomplished by connecting a resistor between non-inverting input 106 and reference potential 501, and connecting a substantially equal resistor between input 156 and the reference potential. To further improve accuracy, the circuit can be augmented to include additional circuitry means to compensate for the input bias currents of each input amplifier, such that an extremely large differentia input impedance is presented to an external DUT by the amplifier system. Additionally, circuitry may be provided to adjust the residual input voltage offset errors of each of the input amplifiers.

In contrast to previously described embodiments, the circuit design depicted in FIG. 8 incorporates a generalized servo controller block rather than just a servo integrator circuit. The controller block may comprise a plurality of interconnected functional units, some of which are described in detail below. Circuitry is also provided within servo controller 90 for bi-directional communication with an external device such as, for example, a microcontroller or digital signal processor. The communications pass through port 94 and may include both data/control commands sent to the servo controller, as well as responses sent back by the servo controller.

When the integrator within the servo controller is allowed to operate continuously, the low-frequency servo feedback imparts a high-pass characteristic to the transfer function of the amplifier apparatus. More specifically, the nominal differential gain of the cross-coupled stage remains essentially constant for signals above the cutoff frequency, and rolls off toward zero as the frequency approaches DC. For certain specialized applications, however, is it not permissible to attenuate any low frequency signals at all while measuring the response of a DUT to an externally applied excitation, and yet the DC bias of that device must nevertheless be substantially blocked.

Accurate response for frequencies below 1 Hertz is particularly important when measuring the time-varying potentials present on electrochemical cells. In the case where an externally applied excitation current comprises square or rectangular waveforms, accurate low frequency phase response is critical to avoid distortion in the waveform shapes appearing across the terminal of the DUT in response to the excitation current; this type of distortion is commonly referred to as "tilt" distortion. By using a very slow integrator, phase distortion can be minimized, however, a very slow integrator necessarily requires a considerable period of time to reach equilibrium, which can be troublesome when measurements must be made rapidly on different cells.

The time to reach an equilibrium state may be reduced without sacrificing DC accuracy if an integrator with a nominal time constant of several seconds is coupled to a 'track and hold' circuit, so that, once equilibrium is established during the 'tracking' phase, the 'hold' mode is asserted whereby the servo feedback signals are held at a constant value just sufficient to null out the average DC signal component. In the "hold" mode, the servo integrator is disabled, allowing any changes in the voltage present across the DUT, even including square waves and abrupt DC steps, to be accurately detected, amplified and presented at the main output. In some applications, it may be desirable to re-enable the track mode to periodically reacquire the DC bias of the DUT to accommodate very slow changes in its DC bias. This condition arises, for example, when measurements are being made on a cell that is being slowly charged or discharged.

When a cell or battery is connected to a battery charger, the currents flowing through the cell/battery will often have significant AC components, for example, 120 Hertz ripple. As these currents interact with the intrinsic impedance of the cell/battery, corresponding AC voltages will develop within the cell that add to the intrinsic open circuit voltage of the cell, so that the total voltage between the terminal will have both a DC component (the intrinsic voltage of the cell/battery) and an AC component. The AC component represents an unwanted noise signal. In order for the inventive amplifier to achieve a stable equilibrium point when connected to such a DUT, these AC voltage components must not be allowed to interfere with the action of the servo feedback loop. Therefore, controllable means, such as, for example, a low-pass filter with controllable slope and cutoff frequency, may be incorporated within the servo controller to attenuate such noise signals sufficiently that the equilibrium point will be related solely to the average DC potential of the cell/battery.

Depending on the particular application, the characteristics of such external AC signal components can vary so widely that a single fixed-frequency low pass filter may not suffice. Consequently, the servo controller may incorporate a number of different function units representing controllable filtering circuitry that can be called upon as required. Additional function units may include, but are not limited to: means to adjust the time constant of the integrator; a median filter with controllable characteristics; an envelope detector; a notch filter having controllable center frequency, notch attenuation depth and notch width; signal limit detection circuitry having controllable thresholds; and a means to set the servo control output signals to predetermined values. Any of these function units may be implemented using analog circuitry exclusively or using a combination of analog and digital circuitry. It should be clear to those skilled in the art that such function units could be adapted to operate either individually or in combination. Likewise, such function units could be incorporated as desired within any of the embodiments of the invention without departing from the scope of the inventive method.

Figure 9:
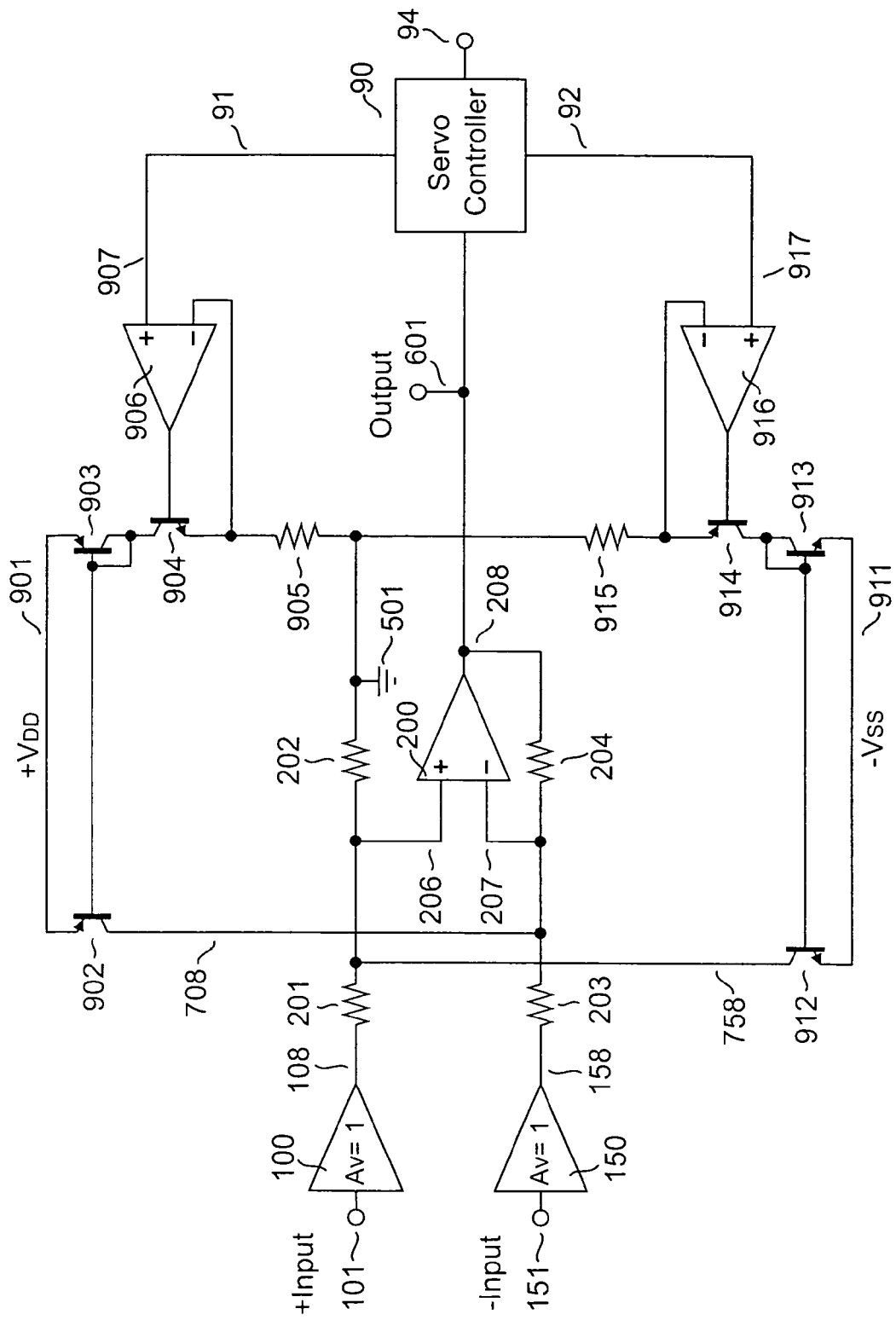
FIG. 9 is a schematic circuit diagram of an alternative differential amplifier configuration with cascaded stages and complementary current-mode servo feedback according to an illustrative embodiment of the present invention.

In every embodiment described thus far, the current sources have been bipolar types capable of both sinking and sourcing current, thereby accommodating connection to a DUT having a DC bias of either relative polarity. Specifically, the servo control loop will be able to adjust the feedback to provide an average DC level of zero volts (e.g., the preferred reference potential) at the main output node 601, irrespective of the polarity of the DC voltage presented across inputs 101 and 151. In the special case where the DUT will always be connected with a predetermined polarity, unipolar current sources may be used as shown in FIG. 9, operative as follows.

A differential input signal is impressed between +Input 101 and −Input 151, buffered by unity gain amplifiers 100 and 150, and conveyed therefrom to amplifier 200, which by means of the connections of resistors 201–204, converts the differential signal into a single ended output at output 601. Servo controller 90 comprises at least an analog or digital servo integrator. A copy of the output signal 601 is conveyed to servo controller 90, and output control signals 91 and 92 are coupled to a pair of controllable current sources each comprising an operational amplifier, a current-sensing resistor and a transistor operative as pass element. The potential provided at non-inverting input 907 of amplifier 906 is forced to appear at one terminal of resistor 905, the other terminal of which is connected to reference ground 501, thereby causing a proportional current to flow through pass transistor 904. A second controlled current source comprising elements 913, 914 and 916 operates in the same manner, and connects to current mirror transistor 912. Thereafter, collector current from current source transistor 904 is conveyed to a current mirror comprising transistors 902 and 903, and the collector current from current source transistor 914 is conveyed to a current mirror comprising transistors 912 and 913. The output currents 708 and 758 of transistors 902 and 912, respectively, constitute complementary current-mode servo feedback. In this example, simple bipolar transistor current mirrors are used, but, without departing from the intended scope of the invention, Mosfet devices could be employed instead. Likewise, other unipolar controlled current sources/topologies and other current mirror embodiments may be substituted.

While the circuit depicted in this figure requires that the positive terminal of a device-under-test always be connected to input 101 while its negative terminal is connected to input 151, this convention could be reversed simply by interchanging the connections of the current source outputs 708 and 758, and reversing the relative polarity of the control signals issuing from servo controller 90.

For those applications where servo feedback is needed, but true differential inputs are not, the differential embodiments described above may be reduced to their single-ended derivatives. Each of these single-ended circuits operates in the same manner as its differential counterpart, so no additional descriptions need be provided.

Figure 10:
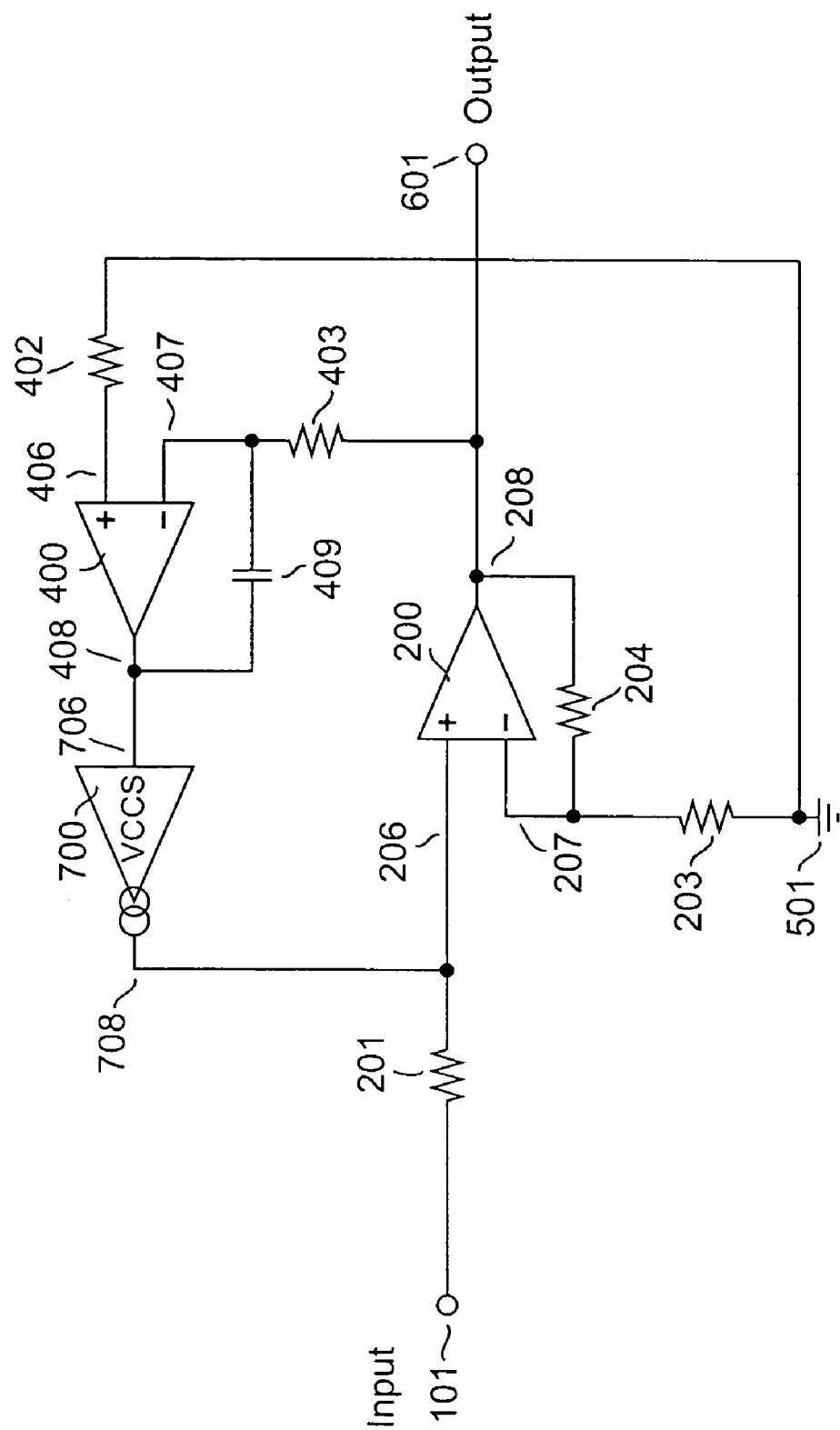
FIG. 10 is a schematic circuit diagram of a single-ended amplifier configuration with current-mode servo feedback according to an illustrative embodiment of the present invention.

FIG. 10 represents a single-ended version of the embodiment presented in FIG. 5. Here, current source 750 has been omitted entirely, and resistor 203 no longer serves as an input coupling element, but is instead connected to reference potential 501. The servo loop will operate to establish an equilibrium condition, irrespective of the relative polarity of a bias potential present by a DUT connected between input 101 and reference potential 501.

Figure 11:
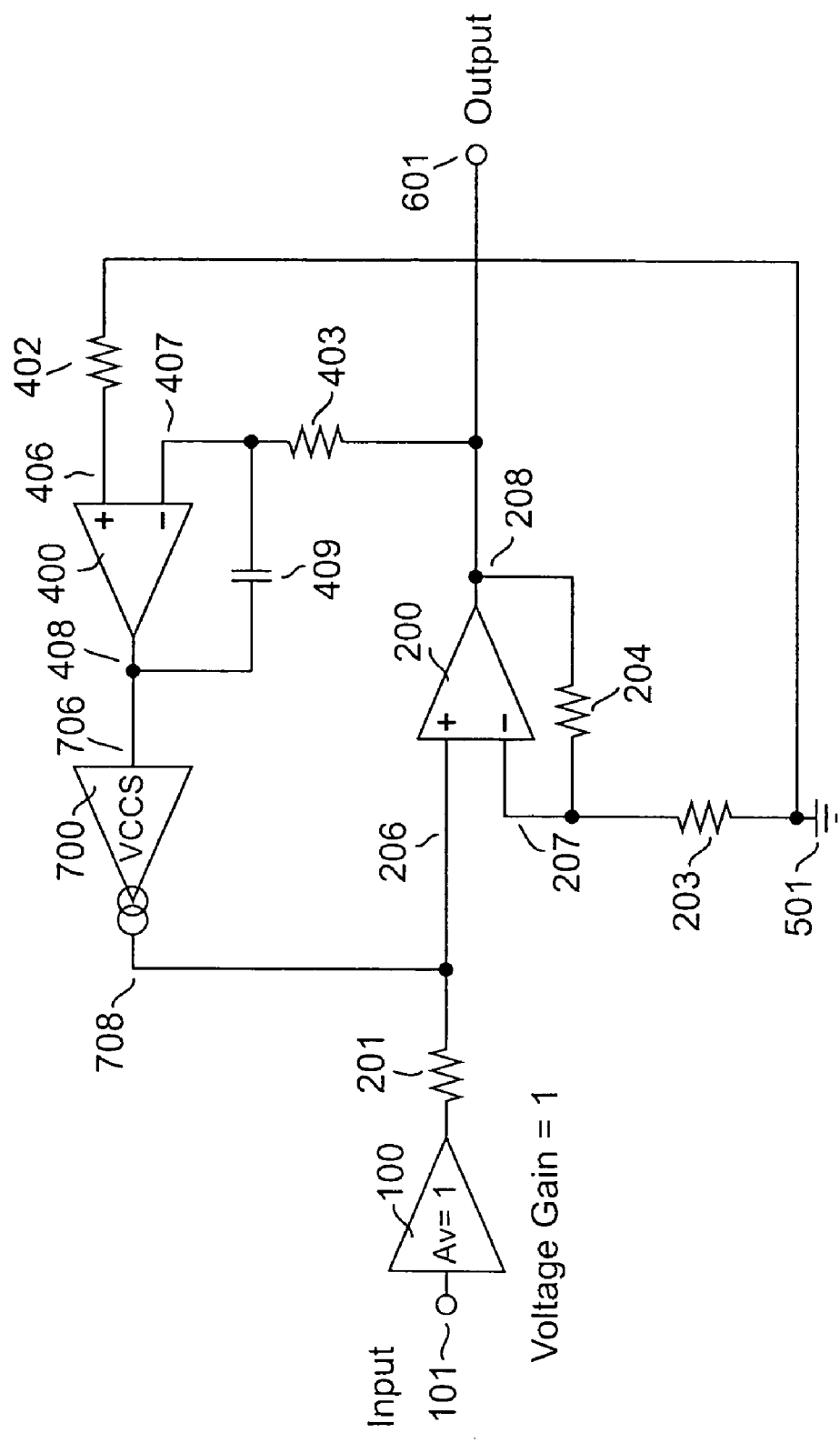
FIG. 11 is a schematic circuit diagram of an alternative single-ended amplifier configuration with current-mode servo feedback according to an illustrative embodiment of the present invention.

FIG. 11 represents a single-ended version of the embodiment presented in FIG. 6. In this variation, both input buffer 150 and current source 750 have been omitted, while resistor 203 connects between node 207 and reference potential 501. The servo loop will operate to establish an equilibrium condition, irrespective of the relative polarity of a bias potential present by a DUT connected between input 101 and reference potential 501.

Figure 12:
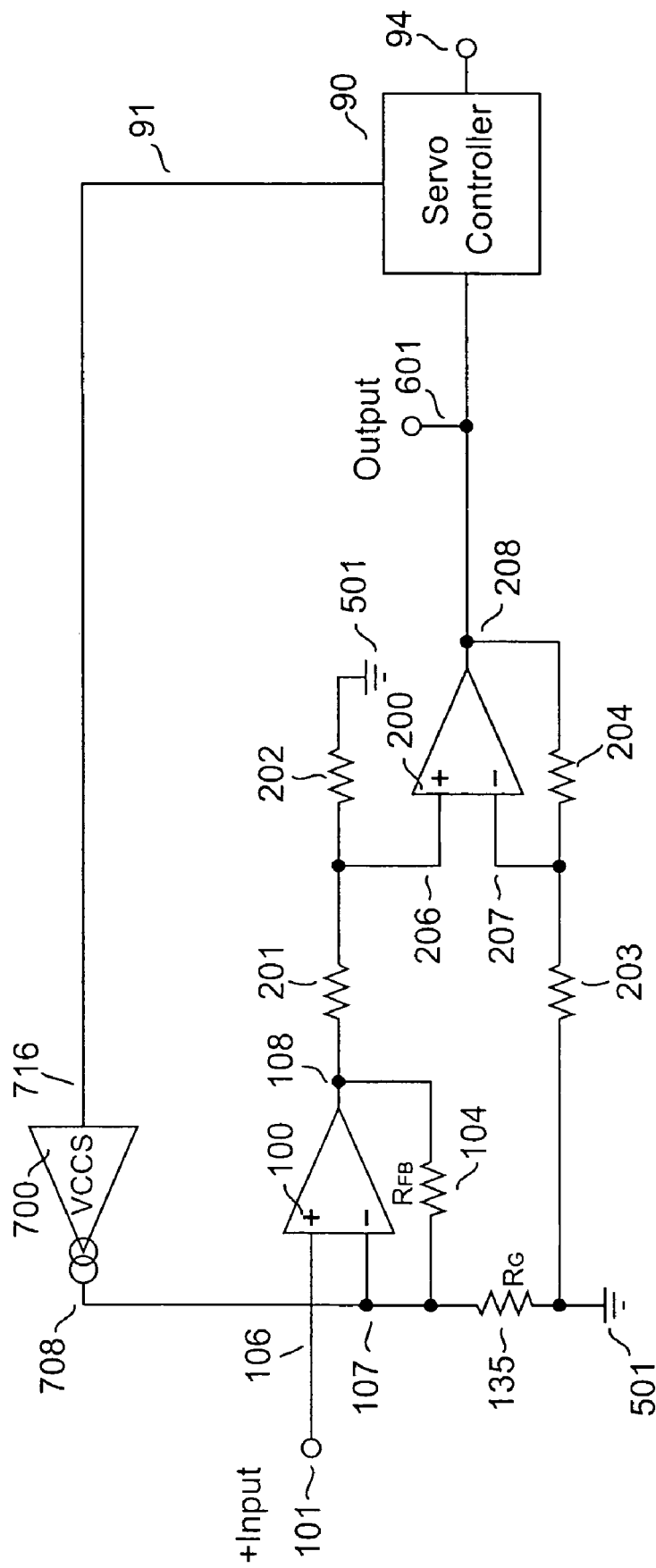
FIG. 12 is a schematic circuit diagram of another alternative single-ended amplifier configuration with current-mode servo feedback according to an illustrative embodiment of the present invention.

FIG. 12 represents a single-ended version of the embodiment presented in FIG. 8, wherein elements 150, 154 and 750 are all omitted, and resistor 203 connects between node 207 and a reference potential 501. In addition, resistor 135 connects directly between node 107 and reference potential 501. The servo loop will operate to establish an equilibrium condition, irrespective of the relative polarity of a bias potential present by a DUT connected between input 101 and reference potential 501.

In an exemplary application of the present invention, small signals are measured at the terminals of an electrochemical accumulator. The open-circuit voltage of a lead-acid cell will be around 2 volts. The current-mode excitation develops small time-varying polarization voltage signals having a peak-to-peak amplitude of perhaps 20 millivolts or less. To achieve the necessary measurement precision for these small signal components, amplification by at least a factor of 100 is desirable. However, if this degree of amplification is applied directly to the raw signal, the overall amplitude at the amplifier's output would reach 200 volts. Such a large output excursion cannot be readily achieved by small signal amplifiers. Furthermore, digitization for subsequent digital signal processing would clearly be problematic. Accordingly, a means must be employed to offset the comparatively large DC signal component prior to amplification.

In the particular case wherein the current-mode excitation comprises square or rectangular waveforms, the offset compensation scheme must allow the DC and very low frequency components of the signal of interest to pass through the system unimpeded, while still removing the large, static DC voltage of the cell/battery. This seemingly paradoxical requirement may be met by using a two-step process. The necessary offsetting compensation signal is first developed by allowing the servo loop to run to establish an equilibrium wherein the DC component has been nulled out, and thereafter, the compensation is held constant at its equilibrium value. By this means, all changes in the cell's terminal voltage occurring after the compensation has been made constant will be accurately detected, irrespective of their spectral characteristics.

Several embodiments of the present invention have been described, and it should be understood that variations might be made without departing from the scope and spirit of the present invention.

What is claimed is:

1. An amplifier apparatus comprising:
   differential inputs disposed to receive a first and second input signal;
   a primary differential amplifier having inverting and non-inverting input nodes receiving said first and second input signal through respective first and second impedance elements and providing a main output signal; and
   feedback circuitry disposed to sample said main output signal and convey complementary current-mode negative feedback signals to said inverting and non-inverting input nodes.

2. An amplifier apparatus comprising:
   differential inputs disposed to receive a first and second input signal;
   a primary differential amplifier having inverting and non-inverting input nodes receiving said first and second input signal through respective first and second impedance elements and providing a main output signal; and
   feedback circuitry disposed to sample said main output signal and convey complementary current-mode negative feedback signals to said inverting and non-inverting input nodes, wherein said current-mode feedback signals are each servo feedback signals having the same low-pass characteristic.

3. The amplifier apparatus according to claim 2 further comprising controllable circuitry to adjust common-mode gain of said primary differential amplifier at DC and at selected AC frequencies.

4. The amplifier apparatus according to claim 2 further comprising controllable circuitry to adjust the differential mode gain of said primary differential amplifier at DC and at selected AC frequencies.

5. The amplifier apparatus according to claim 2 further comprising controllable circuitry to adjust the input offset voltage of said primary differential amplifier.

6. The amplifier apparatus according to claim 2, further comprising a unity-gain input buffer connected in series with each of said differential inputs.

7. The amplifier apparatus according to claim 6, further comprising:
a biasing element disposed between the input of the one of said unity-gain buffers and a reference potential; and
a biasing element disposed between the input of the other of said unity-gain buffers and said reference potential.

8. The amplifier apparatus according to claim 6 further comprising controllable means to adjust input offset voltages of said unity-gain input buffers.

9. The amplifier apparatus according to claim 6 further comprising controllable means to compensate for bias current required for proper operation of the non-inverting input of each said unity-gain input buffers.

10. An amplifier apparatus comprising:
a first input differential amplifier disposed to receive a first input signal at its non-inverting input and output a first intermediate output signal;
a second input differential amplifier disposed to receive a second input signal at its non-inverting input and output a second intermediate output signal;
a primary differential amplifier disposed to receive at its non-inverting input said first intermediate output signal conveyed through a first impedance element and to receive at its inverting input said second intermediate output signal conveyed through a second impedance element, and provide a main output signal at its output node; and
feedback circuitry disposed to sample said main output signal and convey a first negative feedback signal to said inverting input of said first input differential amplifier, and a second negative feedback signal to said inverting input of said second input differential amplifier.

11. The amplifier apparatus according to claim 10 further comprising:
a third impedance element connected between the inverting input of said primary differential amplifier and said output node of said primary differential amplifier; and
a fourth impedance element connected between the non-inverting input of said primary differential amplifier and a reference potential.

12. The amplifier apparatus of claim 10 comprising:
a fifth impedance element connected between the inverting input of said first input differential amplifier and the output of said first input differential amplifier;
a sixth impedance element connected between the inverting input of said second input differential amplifier and the output of said second input differential amplifier; and
a seventh impedance element connected between said inverting inputs of said first and second input differential amplifiers.

13. The amplifier apparatus according to claim 10, further comprising:
a biasing element disposed between the non-inverting input of a first input differential amplifier and a reference potential; and
a biasing element disposed between the non-inverting input of a second input differential amplifier and a reference potential.

14. The amplifier apparatus according to claim 10 further comprising circuitry to adjust common-mode gain of at least one of said input differential amplifiers at selected frequencies.

15. The amplifier apparatus according to claim 10 further comprising circuitry to adjust differential-mode gain of at least one of said input differential amplifiers at selected frequencies.

16. The amplifier apparatus according to claim 10 further comprising circuitry to compensate for bias current required for proper operation of the non-inverting input of each said differential amplifier.

17. The amplifier apparatus according to claim 1 wherein said complementary negative feedback signals have substantially identical magnitudes.

18. The amplifier apparatus according to claim 2 wherein said feedback circuitry comprises:
an integrator; and
a first and second controllable current-source controlled by said integrator, said current sources providing current-mode output signals of opposite relative polarity.

19. The amplifier apparatus according to claim 18 wherein said integrator further comprises means to produce an inverted signal controlling at least one said current source.

20. The amplifier apparatus according to claim 18 wherein said integrator comprises:
an analog-to-digital converter disposed to sample said main output signal and provide a digital output signal;
a virtual integrator receiving said digital output signal and providing a digital integral signal representing the time-integral said main output signal; and
a digital-to-analog converter that receives said digital integral signal and provides a corresponding analog signal representing a control signal adapted to control said first and second current sources.

21. The amplifier apparatus according to claim 18 wherein:
said first controlled current source provides a first bipolar output current that is inversely proportional to a control signal from said integrator; and
said second controlled current source provides a second bipolar output current that is directly proportional to said control signal.

22. The amplifier apparatus according to claim 18 wherein:
said first controlled current source provides a first bipolar output current that is inversely proportional to a control signal from said integrator; and
said second controlled current source provides a second bipolar output current that is directly proportional to said control signal.

23. The amplifier apparatus according to claim 18 wherein:
said first controlled current source provides a first unipolar output current that is inversely proportional to a control signal from said integrator; and
said second controlled current source provides a unipolar output current that is directly proportional to said control signal from said integrator.

24. The amplifier apparatus according to claim 2 further comprising:
a servo controller; and
circuitry adapted to communicate with an external controller.

25. The amplifier apparatus of claim 2 further comprising: track and hold circuitry coupled to said feedback circuitry.

26. The amplifier apparatus according to claim 18 further comprising:
a controllable low-pass filter disposed to reduce the high frequency content of signals input to said integrator.

27. The amplifier apparatus according to claim 18 further comprising:
a controllable notch filter disposed to reduce the amplitude of a predetermined range of frequencies within signals input to said integrator.

28. The amplifier apparatus according to claim 18 further comprising:
a controllable impulse noise discriminator disposed to reduce the impulse noise content of signals input to the integrator.

29. The amplifier apparatus according to claim 2 further comprising circuitry for developing a control signal for at least one controlled voltage source.

30. A signal detection and amplification system comprising amplifier apparatus having:
differential inputs disposed to receive a first and second input signal;
a primary differential amplifier receiving said first and second input signal and providing a main output signal; and
feedback circuitry disposed to sample said main output signal and convey complementary current-mode negative feedback signals to said differential inputs.

31. The signal detection and amplification of claim 29 adapted to test electrochemical cells.

32. The signal detection and amplification system of claim 29 adapted to monitor a plurality of electrochemical cells.

33. The signal detection and amplification system of claim 29 adapted to provide feedback to a charger for electrochemical cells.

34. The signal detection and amplification system of claim 29 adapted to analyze impedance of electrochemical cells.

35. A method for compensating an output of an amplifier system comprising:
integrating said output to generate a feedback control signal;
controlling a pair of complementary current mode feedback signals with said feedback control signal;
connecting said pair of complementary current mode feedback signals to input nodes of a primary amplifier wherein said input nodes are connected through impedance elements to differential inputs of said amplifier system.

36. The method according to claim 35 wherein said feedback signal causes said amplifier system to exhibit a high pass characteristic and attenuate a predetermined low-frequency component of said output.

37. The method according to claim 35 comprising:
coupling a differential input signal to inputs of each of two unity gain amplifiers, whereby the first unity-gain amplifier produces a first intermediate output signal and the second unity-gain amplifier produces a second intermediate output signal;
conveying said first intermediate output signal through a first impedance element to the non-inverting input of a primary differential amplifier; and
conveying said second intermediate output signal through a second impedance element to the inverting input of said primary differential amplifier that provides a main output signal.

38. The method according to claim 35 wherein said integrating step is performed by a controllable integrator including only analog circuitry.

39. The method according to claim 35 wherein said step of integrating is performed by a controllable integrator including a combination of analog and digital circuitry.

40. An amplifier apparatus comprising:
a primary amplifier providing a main output signal; and
feedback means disposed to sample said main output signal and convey complementary current-mode negative feedback signals to said primary amplifier.

41. An amplifier apparatus comprising:
a primary amplifier providing a main output signal; and
feedback means disposed to sample said main output signal and convey complementary current-mode negative feedback signals to said primary amplifier, wherein a DC value of said main output signal is substantially equal to a reference potential.

* * * * *